United States Patent [19]

Drechsel

[11] Patent Number: 5,292,486
[45] Date of Patent: Mar. 8, 1994

[54] CRYSTAL PULLING METHOD AND APPARATUS FOR THE PRACTICE THEREOF

[75] Inventor: Dieter Drechsel, Bruchköbel, Fed. Rep. of Germany

[73] Assignee: Leybold Aktiengesellschaft, Hanau, Fed. Rep. of Germany

[21] Appl. No.: 747,532

[22] Filed: Aug. 20, 1991

[30] Foreign Application Priority Data

Jul. 15, 1991 [DE] Fed. Rep. of Germany ....... 4123336

[51] Int. Cl.⁵ .............................................. B01D 9/00
[52] U.S. Cl. .............................. 422/249; 156/617.1; 422/252; 422/253
[58] Field of Search ............... 156/601, 616.41, 617.1, 156/618.1, 619.1, 620.74; 422/249, 252, 253

[56] References Cited

U.S. PATENT DOCUMENTS

| | | | |
|---|---|---|---|
| 3,882,319 | 5/1975 | Clement et al. | 156/601 |
| 3,958,129 | 5/1976 | Clement et al. | 156/601 |
| 4,410,494 | 10/1983 | Fiegl | 422/249 |
| 4,454,096 | 6/1984 | Lorenzini et al. | 422/249 |
| 4,710,258 | 12/1987 | Latka | 156/617.1 |
| 4,915,775 | 4/1990 | Katsuoka et al. | 156/601 |
| 4,980,015 | 12/1990 | Ono et al. | 156/605 |
| 5,009,863 | 4/1991 | Shima et al. | 156/617.1 |
| 5,030,315 | 7/1991 | Washizuka et al. | 156/601 |
| 5,089,238 | 2/1992 | Araki et al. | 156/617.1 |

FOREIGN PATENT DOCUMENTS 3904858 9/1989 Fed. Rep. of Germany.
4030551 4/1991 Fed. Rep. of Germany.

OTHER PUBLICATIONS

Leybold AG prospectus No. 045.9.60.61.045.02 5.02.89 T&D, entlted "Crystal Growing".

Primary Examiner—Olik Chaudhuri
Assistant Examiner—Felisa Garrett
Attorney, Agent, or Firm—Felfe & Lynch

[57] ABSTRACT

A method and an apparatus are proposed for pulling crystals from the melt. The recharging of the melt (4) is performed such that the crucible (3) is raised and lowered with respect to the crystal pulling system while keeping the position of the melt surface (25) constant with respect to the crystal pulling system. In particular it is proposed that, during a first time interval (34) the amount of recharge (37) per unit time be greater than the average amount of recharge (38, 39) per unit time that would be necessary in order to make up for the consumption of material by the growing crystal (5), that during a second time interval (45) the amount of recharge (46) per unit time be less than the average recharge amount per unit time that would be necessary in order to make up for the consumption of material by the growing crystal, that during the first time interval the crucible (3) be lowered to keep the melt surface constant with respect to the crystal pulling apparatus, that during the second time interval the crucible (3) be raised to keep the melt surface constant with respect to the crystal pulling apparatus. By the invention, erosion ring grooves on the inside wall of the crucible are prevented and thus the useful life of the crucible is considerably lengthened. The method according to the invention can be practiced on existing apparatus.

1 Claim, 4 Drawing Sheets

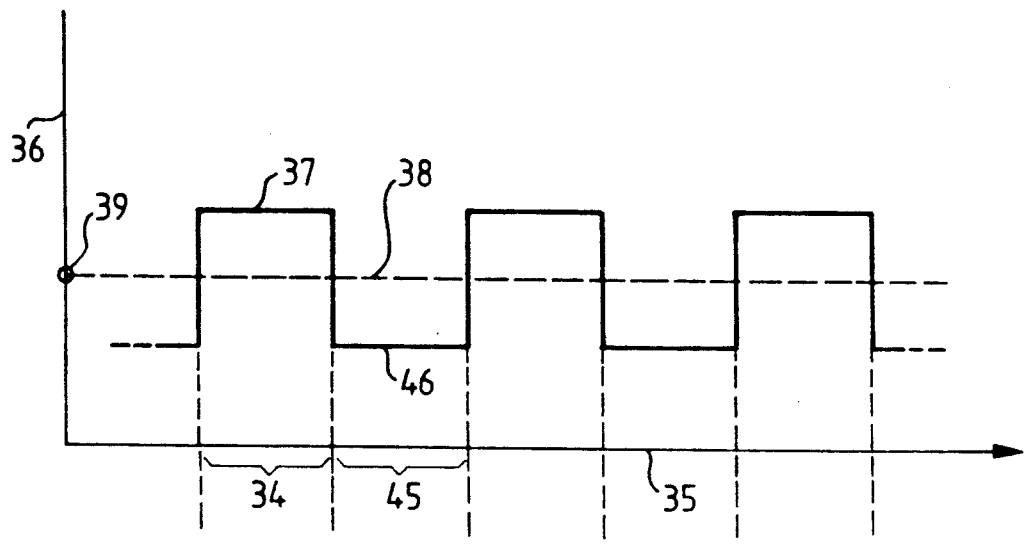
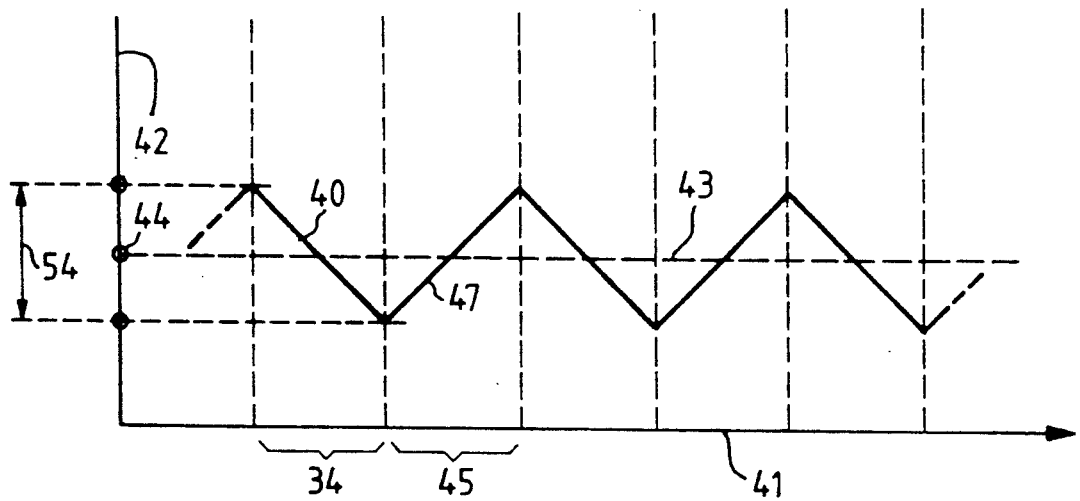

CRYSTAL PULLING METHOD AND APPARATUS FOR THE PRACTICE THEREOF

The invention relates to a method for pulling crystals from the melt, preferably a monocrystal pulling method, with a crystal pulling apparatus which has an apparatus for measuring the position of the surface of the melt during the pulling process, a charging apparatus for recharging the melt during the pulling process, a positioning apparatus for the positioning of the melting crucible during the pulling process.

In the crystal-growing field a great number of different methods are known, such as crystal growing from the gas phase, from the solution and from the melt. The various methods for crystal growing from the melt have achieved a leading position over the other methods of growing, on account of their greatly developed technology and productivity.

In crystal growing from the melt, a great variety of crucible processes are being used. For example, there is the so-called Kyropoulos process, which is characterized by the immersion of a chilled seed crystal in the melt. There is also the so-called Czochralski process in which a crystal is pulled from the melt. Also there is the Bridgman process, which is characterized by a vertical lowering of a crucible in the temperature gradient.

The Bridgman process also exists, which is characterized by a vertical lowering of a crucible in the temperature gradient. Lastly, there is vertical zone melting without a crucible.

In Leybold's prospectus No. 045.9.60.61.045.02 5.02.89 T&D, entitled "Crystal Growing," the said apparatus and methods for pulling crystals from the melt are described. This state of the art can serve as the starting point of the present invention. This is especially true of the figure on page 9 of Leybold's prospectus.

The state of the art also includes German Patent Disclosure Document No. 3904858.

This Disclosure Document reveals a method for controlling a molten bath, especially a molten bath for growing monocrystals or bodies consisting of a plurality of crystals.

In the Disclosure Document it is proposed that, to control the level and/or the configuration of the surface of the bath, the level of the bath surface be measured by triangulation by means of at least one light beam issuing from a light source, reflected from the surface of the molten bath and received by a light receiver.

In practice it is found to be very disadvantageous that, in the area of the inner surface of the crucible, which is adjacent to the surface of the melt, an erosion of the wall of the crucible takes place due to chemical reactions.

Now, if the melt surface remains during the crystal pulling process always in the same position with respect to the inner surface of the melting crucible, as is the case in the state of the art, very soon a deep, annular groove-like erosion of the inner surface of the crucible occurs. The consequence of this is that, in the state of the art, the useful life of melting crucibles is considerably reduced.

The present invention sets for itself the task of overcoming this disadvantage of the state of the art. The useful life of the melting crucibles is to be prolonged, thereby making the entire crystal pulling process more economical.

The present invention is also addressed to the task of providing precise instructions for the use of the subject of German Patent Disclosure Document 3904858 for the avoidance of the above-described great, concentrated erosion of the inside surface of the melting crucible.

It is also an objective to make available to the industry a method which can be used in conventional crystal pulling apparatus without the need to change the structure of the latter.

The stated objectives are achieved in accordance with the invention by performing the recharging so that the melting crucible is raised and lowered with respect to the crystal pulling apparatus while the melt surface position is constant.

In particular it is proposed that, during the first time interval the amount charged per unit time be greater than the average rate of recharge per unit time that would be necessary in order to make up for the consumption of material by the growing crystal, that during a second time interval the rate of recharge per unit time be less than the average rate of recharge per unit time that would be necessary in order to make up for the consumption of material by the growing crystal, that during the first time interval the melting crucible be lowered to keep the melt surface constant with respect to the crystal pulling apparatus, and that during the second time interval the melting crucible be raised with respect to the crystal pulling apparatus to keep the melt surface constant.

For the practice of the described method it is proposed that a regulating system be provided, to which, as its input, the measured actual value of the position of the melt surface with respect to the crystal pulling apparatus will be delivered as an input signal, and to which, at its input, a guiding magnitude will be fed which will define the movements of the melting crucible with respect to the crystal pulling apparatus.

Alternatively, provision can be made for the control algorithm to be installed beforehand in the regulating system.

The following advantages are achieved by the invention:

Without any great structural investment, the useful life of the melting crucible is considerably extended, essentially only by technical process and control measures. In this manner an economical crystal pulling process is achieved.

Additional details of the invention, of what it seeks to accomplish and the advantages which it offers are to be found in the description that follows of an embodiment of the invention.

This embodiment is explained with the aid of five figures:

FIGS. 4 and 5 show diagrams explaining the crystal pulling method according to the invention.

The following description of the embodiment of the invention sets out from a state of the art as represented in the form of the publications cited above.

The descriptions and the figures in these publications can be used to explain the basis from which the embodiments of the invention described below set out.

Figure 1:
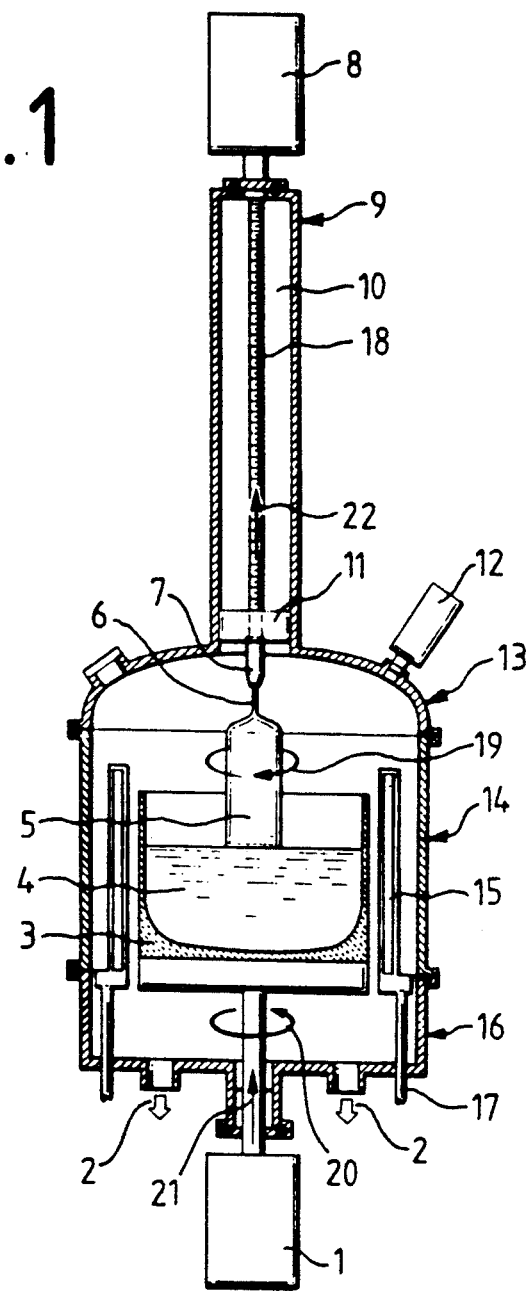
FIG. 1 shows an apparatus for pulling crystals according to the state of the art.

FIG. 1 is taken from the patent cited, page 9. 1 identifies the crucible driving device in FIG. 1. The reference numbers 2 indicate the inert gas exhausts. 3 is the crucible, and the melt bears the number 4. 5 is the reference number for the crystal that is pulled from the melt. 6 is the seed crystal or inoculant which is held by the seed crystal holder 7.

8 indicates the crystal driving apparatus which drives the pulling shaft 18. 9 indicates the point of entry of the inert gas into the lock chamber 10. 11 is the diagrammatically represented lock valve.

12 is an optical sensor for measuring the position of the surface of the melt 4. 13 is the pulling bell. The furnace body bears reference number 14. 16 is the system for heating the melt 4. The power input to the heating system bears the reference number 17. 16 is the furnace bottom.

Additional details on the construction of apparatus for crystal pulling and details of the method can be learned not only from the prospectus cited above but also from the comprehensive scientific literature and patent literature. German patent disclosure document 3904858 is mentioned merely by way of example.

Essentially, the crystal pulling method in accordance with FIG. 1 is practiced as follows:

The starting material melts in the crucible 3. The seed crystal 6 plunges into the melt 4 and is wetted by it, i.e., is slightly melted. Then the seed crystal is pulled up out of the melt. The crystal forms. On the pulling shaft 18 is the seed crystal holder 7 which pulls the seed crystal and at the same time sets it in rotary movement. The crucible also rotates. The crystal and crucible turn in opposite directions. In FIG. 1 the arrow 19 indicates the rotation of the crystal. The arrow 20 indicates the rotation of the crucible. During the pulling the crucible is raised. This is indicated by the arrow 21. Also, during the pulling process the rotating pulling shaft 18 is pulled upward. This is indicated by the arrow 22.

Figure 2:
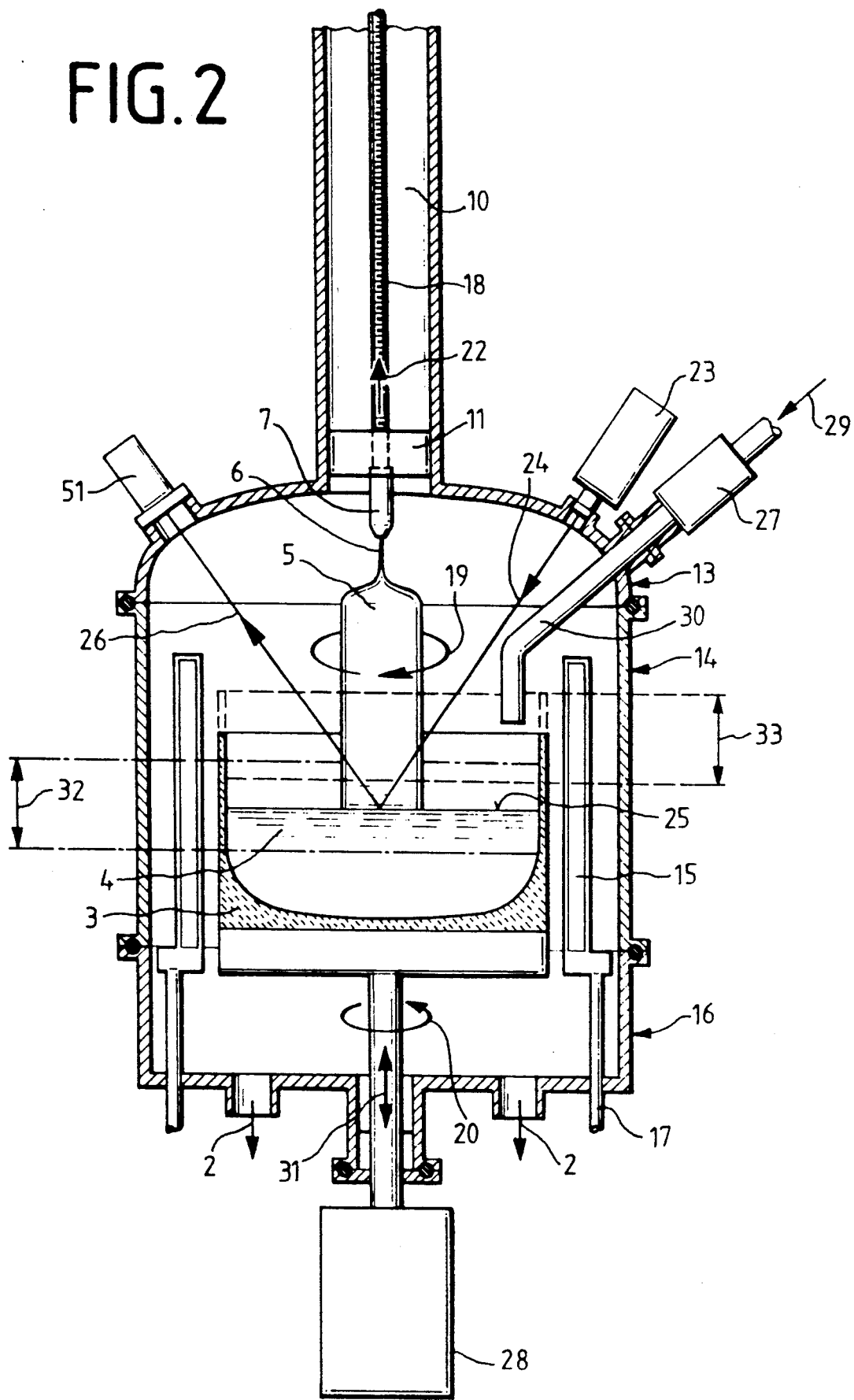
FIG. 2 shows a crystal pulling apparatus with which the method of the invention can be practiced.

FIG. 2 shows the crystal pulling apparatus in accordance with FIG. 1, but with a device for measuring the position of the surface of the melt, with an apparatus for recharging the melt, and with a positioning device for positioning the crucible during the pulling process.

Identical components of the objects in FIGS. 1 and 2 are provided with the same reference numbers.

In FIG. 2, 23 indicates a light source which emits a measuring light beam 24. This measuring light beam is reflected at the melt surface 25. The reflected part of the measuring light beam bears the reference number 26. 51 is a light receiver. 51 and 23 are therefore components of the system for measuring the position of the surface of the melt. The charging system is indicated at 27. The positioning apparatus bears the reference number 28.

Charge material is fed to the charging system as indicated by the arrow 29. In accordance with a magnitude indicated by a signal put out by a control system (see the description of FIGS. 3 to 5), a precisely measured charge is added by the charging apparatus. The measured charge passes through the tube 30 into the melt 4.

The positioning apparatus 28 also operates in accordance with a magnitude signal made available by the control system. The position of the crucible is varied by the positioning apparatus. This is indicated by the double arrow 31.

Depending on the purpose for which the present invention is employed, two important requirements must be satisfied by the crystal pulling method and by the crystal pulling apparatus in accordance with the invention:

First requirement: In accordance with the amount of material removed from the melt by the growing crystal, fresh material must be added to the melt so that the surface of the melt will maintain or virtually maintain its established position with respect to the crystal pulling apparatus.

Second Requirement: The melting crucible, that is to say, its inside wall, is to perform and up-and-down motion with reference to the invariable position of the surface of the melt, so that the inside wall of the crucible will become comparatively lightly eroded over a desired band width or erosion width (see reference number 32 in FIG. 2), instead of having the erosion concentrated within a narrow range as in the state of the art. The motion of the crucible is indicated at 33 in FIG. 2. The width of the band 32 corresponds to the size of the motion 33. In FIG. 2 the crucible is represented in its middle position.

These requirements are satisfied by two steps:

First Step:

During a first time interval (see section 34 of the time axis [abscissae] 35 of the diagram in FIG. 4) the amount of charge added per unit time is greater than the average amount of charge added per unit time that is needed in order to make up for for the material consumed by the growing crystal.

In FIG. 4, the amount of charge added per unit time is recorded on the ordinates 36. Length 37 indicates the heavier recharging over the time interval 34.

The broken line 38 and point 39 on the ordinates represent the average amount of charge added per unit time that is required in order to make up for for the material consumed by the growing crystal.

During the first time interval the crucible is lowered simultaneously to keep the melt surface constant with respect to the crystal pulling apparatus. This is represented in FIG. 5 by the line 40.

In FIG. 5 the abscissae 41 are again the time axis. The position of the crucible with respect to the crystal pulling apparatus is recorded on the ordinates 42. The broken straight line 43 and point 44 represent the middle position of the melting crucible with respect to the crystal pulling apparatus. The first time interval is indicated at 34 on the abscissae of FIG. 5.

Second Step:

During a second time interval (see sections 45 of the abscissae of FIGS. 4 and 5) the recharge amount per unit time is less than the average recharge amount 38 and 39 per unit time which is required in order to make up for for the material consumed by the growing crystal. This lower recharge amount per unit time is represented in FIG. 4 by the line 46.

During the second time interval 45, to keep the melt surface constant with respect to the crystal pulling apparatus the melting crucible is raised. This is indicated by line 47 of FIG. 5.

Then the first step is again performed, then the second, and so on.

Figure 3:
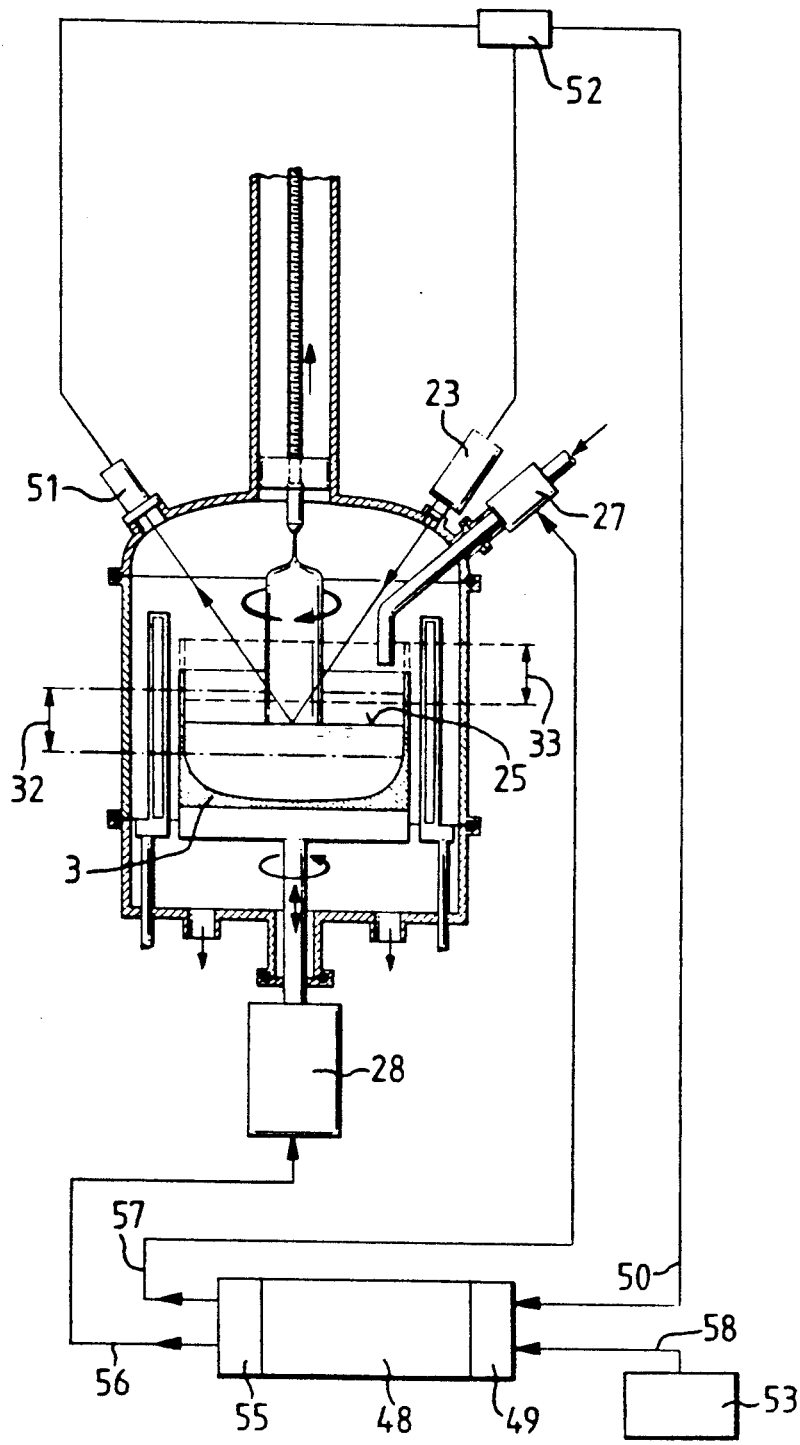
FIG. 3 shows a circuit diagram for the crystal pulling apparatus of FIG. 2.

FIG. 3 shows a crystal pulling apparatus with a circuit diagram for the practice of the crystal pulling method in accordance with the invention.

A control system is identified as a whole by the number 48. The measurement of the actual position of the melt is delivered to its input 49 through a signal line 50. The measuring system consists of components 27, 51 and 52.

Furthermore, a guiding magnitude in the form of a control algorithm is delivered to its input. 53 indicates a memory unit for the guiding magnitude. The memory unit 53 can also be integrated with the control system 48, so that unit 53 and the signal line 58 can be eliminated.

The control algorithm can be varied in accordance with the process parameters desired by the user of the crystal pulling apparatus. The control algorithm determines the width of the erosion band. In FIG. 5 this width is described by the line 54 on the ordinates. The erosion width bears the reference number 32 in FIG. 2.

On the basis of the control algorithm, the control system processes the values given to it for the position of the melt surface so as to form two signals at the output 55 of the control system. These two output signals are, on the one hand, the control magnitude for the positioning apparatus of the crucible, and on the other hand the control magnitude for the charging apparatus 27. The control magnitude for the positioning apparatus is transferred through the signal line 56, and the one for the charging apparatus through the signal line 57.

LIST OF COMPONENTS

1—crucible drive system
2—inert gas outlets
3—crucible
4—melt
5—crystal
6—seed crystal
7—seed crystal holder
8—crystal drive system
9—inert gas inlet
10—lock chamber
11—lock valve
12—optical sensor
13—pulling bell
14—furnace body
15—heating apparatus
16—furnace bottom
17—power input
18—pulling shaft
19—arrow
20—arrow
21—arrow
22—arrow
23—light source, component
24—measuring light beam
25—melt surface
26—measuring light beam
27—charging apparatus
28—positioning apparatus
29—arrow
30—tube
31—double arrow
32—band width, erosion width
33—up-and-down motion
34—section
35—time axis, abscissae
36—ordinates
37—line
38—straight line
39—point
40—line
41—abscissae, time axis
42—ordinates
43—straight line
44—point
45—line
46—line
47—line
48—control system
49—input
50—signal line
51—light receiver, component
52—component
53—memory
54—erosion width
55—output
56—signal line
57—signal line
58—signal line

I claim:
1. Method for pulling crystals from the melt, comprising: utilizing a crystal pulling apparatus which has a device for measuring the position of the surface of the melt during the pulling process, a charging device for recharging the melt during the pulling process, a positioning device for positioning the crucible during the pulling process, and performing the recharging such that, with the position of the melt surface constant with respect to the crystal pulling apparatus, during a first time interval (34) a recharge amount (37) per unit time is greater than an average recharge amount (38, 39) per unit time that would be necessary in order to make up for material consumption by a growing crystal (5), and in which during a second time interval (45) a recharge amount (46) per unit time is smaller than the average recharge amount (38, 39) per unit time that would be necessary in order to make up for the material consumption by the growing crystal (5), and which includes during the first time interval (34), to keep a melt surface (25) constant with respect to the crystal pulling apparatus, lowering the crucible (3) and which includes during the second time interval (45), to keep the melt surface (25) constant with respect to the crystal pulling apparatus, raising the crucible (3).

* * * * *